United States Patent
Shank et al.

(10) Patent No.: US 7,061,222 B2
(45) Date of Patent: Jun. 13, 2006

(54) AUTOMATED TESTING OF FREQUENCY CONVERTER DEVICE

(75) Inventors: Eric A. Shank, Sebastopol, CA (US); Dara Sariaslani, Santa Rosa, CA (US); Gratz L. Armstrong, Santa Rosa, CA (US); Dexter M. Yamaguchi, Windsor, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/691,267

(22) Filed: Oct. 22, 2003

(65) Prior Publication Data

US 2005/0088166 A1 Apr. 28, 2005

(51) Int. Cl.
*G01R 23/14* (2006.01)
*G01R 13/02* (2006.01)
*G01D 18/00* (2006.01)

(52) U.S. Cl. .................. 324/76.23; 324/76.19; 324/76.43; 324/520; 324/537; 702/68; 702/75; 702/76; 702/108

(58) Field of Classification Search .................. 324/85, 324/667, 633, 674, 76.19, 76.23, 76.43; 702/68, 702/108, 75–46
See application file for complete search history.

(56) References Cited

U.S. PATENT DOCUMENTS

| | | | | |
|---|---|---|---|---|
| 5,579,463 A | * | 11/1996 | Takano et al. | 345/440 |
| 5,619,489 A | * | 4/1997 | Chang et al. | 370/241 |
| 5,642,039 A | * | 6/1997 | Bradley et al. | 324/76.53 |
| 5,937,006 A | * | 8/1999 | Clark et al. | 375/224 |
| 6,041,077 A | * | 3/2000 | Clark et al. | 375/224 |
| 6,064,694 A | * | 5/2000 | Clark et al. | 375/224 |
| 6,396,285 B1 | * | 5/2002 | Blackham | 324/601 |
| 6,417,672 B1 | * | 7/2002 | Chong | 324/520 |
| 6,529,844 B1 | * | 3/2003 | Kapetanic et al. | 702/85 |
| 6,820,225 B1 | * | 11/2004 | Johnson et al. | 714/715 |
| 6,825,647 B1 | * | 11/2004 | Kranitzky | 324/85 |

OTHER PUBLICATIONS

User's Guide HP 8753ET HP 875ES Network Analyzers; Hewlett-Packard Company; HP Part No. 875390472, 1999. Available from Agilent Technologies, Inc.

Albert Gleissner, Using the Frequency Conversion Mode of Vector Network Analyzer ZVR; Application Note 1EZ47_0E, Jan. 1999, Products ZVRL, ZVRE, ZVR, ZVC, ZVCE with Option ZVR-B4. Rohde & Schwarz.

* cited by examiner

*Primary Examiner*—Diane Lee
*Assistant Examiner*—Marina Kramskaya

(57) ABSTRACT

A frequency converter is tested. Labels for a plurality of mixing products are displayed. In response to a user selecting a first mixing product from the plurality of mixing products, appropriate frequencies for the first mixing product are calculated. Also, a measurement configuration for the first mixing product is determined.

20 Claims, 8 Drawing Sheets

FIGURE 6

MIXER SETUP

| | | | | |
|---|---|---|---|---|
| 131 — Input | | -17.000 dBm | | |
| 132 — LO1 | 836XX Source | 1.000 dBm | Start/Stop ▶ | 3.543223416 GHz | 6.435678730 GHz |
| 133 — IF = | [1] X Input +/- [1] | X LO1 = [1] [1] | Fixed ▶ | 9.834773200 GHz | |
| | | | Start/Stop ▶ ⊙ + | 13.37799661 GHz | 16.27045193 GHz |
| | | | Start/Stop ▶ ○ − | 6.291549784 GHz | 3.399094470 GHz |
| 134 — LO2 | My Source | 9.000 dBm | Fixed ▶ | 8.544234017 GHz | |
| 135 — Output = | [1] X Input +/- [1] | X LO2 = [1] [1] | Start/Stop ▶ ⊙ + | 21.92223063 GHz | 24.81468594 GHz |
| | | | Start/Stop ▶ ○ − | 4.833762599 GHz | 7.726217913 GHz |

LOs: ○1 ⊙2 ○3 ○4

136 — Hide Diagrams    Load    Save...    Apply    OK    Cancel    Help

138 — Calculate IF & Output
139 — Calculate In & Output
140 — Calculate Input & IF 137 — [Diagram]

Input
Start: 3.543223416 GHz
Stop: 6.435678730 GHz
Power: -17.000 dBm x 1/1 → ⊗ → x 1/1 → In + LO → x 1/1 → ⊗ → x 1/1 → In + LO → Output LO1
Start: 9.834773200 GHz
Stop: 9.834773200 GHz
Power: 1.000 dBm Start: 13.37799661 GHz
Stop: 16.27045193 GHz LO2
Start: 8.544234017 GHz
Stop: 8.544234017 GHz
Power: 9.000 dBm Start: 21.92223063 GHz
Stop: 24.81468594 GHz 141 — Configure         142 — Configure

130

Sweep Type [Start/Stop ▼]

| | Start Frequency | Stop Frequency | Power |
|---|---|---|---|
| Input | 0.000000000 MHz | 0.000000000 MHz | -10.000 dB |

LO [3]/[3] X Input + [0.000000000 MHz]  [-10.000 dB]

IFBW: [100 Hz]   Number of Steps [201]

AUTOMATED TESTING OF FREQUENCY CONVERTER DEVICE

BACKGROUND

The present invention concerns testing of electronic devices and pertains particularly to automated testing of a frequency converter device.

A frequency converter device is used to convert a signal in one frequency range to a signal in another frequency range. For example, a typical frequency converter device uses a mixer to down-convert or up-convert an input signal to an output signal.

For a down-conversion of a high radio frequency (RF) signal to an intermediate frequency (IF) the mixer combines the RF signal with a local oscillator (LO) signal to produce a sum and a difference. The difference gives the down-converted signal.

For an up-conversion of an IF to an RF signal, the mixer combines the IF signal with the LO signal to produce a sum and a difference. The sum gives the up-converted signal.

Various types of testers can be used to test frequency converter devices. For example, a network analyzer can be used to provide input to and measure the output from a frequency converter device. Alternatively, any testing device with the capability to provide input to and measure the output from a frequency converter device can be used.

When stimulated at an input and LO (local oscillator) port, a frequency converting device produces a number of mixing products that show up at the output. These include not only the fundamental mixing products, but harmonics and spurs as well as leakage from the input and LO signals. The user of a tester is typically interested in both the desired output, termed the "fundamental" and one or more of the other mixing products.

When testing a frequency converter device, a user is generally required to specify to the testing device a frequency range of interest for the output signal of the frequency converter device. This can generally be derived from the input signal and the LO signal. However, performing the computations and then appropriately setting the testing device can be inconvenient and cumbersome. Additional complexity is added when determining the expected output from a frequency converter that includes more than one mixer.

SUMMARY OF THE INVENTION

A frequency converter is tested. Labels for a plurality of mixing products are displayed. In response to a user selecting a first mixing product from the plurality of mixing products, appropriate frequencies for the first mixing product are calculated. Also, a measurement configuration for the first mixing product is determined.

BRIEF DESCRIPTION OF THE DRAWINGS

FIG. 3, FIG. 4, FIG. 5, FIG. 6 and FIG. 7 illustrate graphics user interface windows used to enter date for testing in accordance with an embodiment of the present invention.

DESCRIPTION OF THE PREFERRED EMBODIMENT

Figure 1:
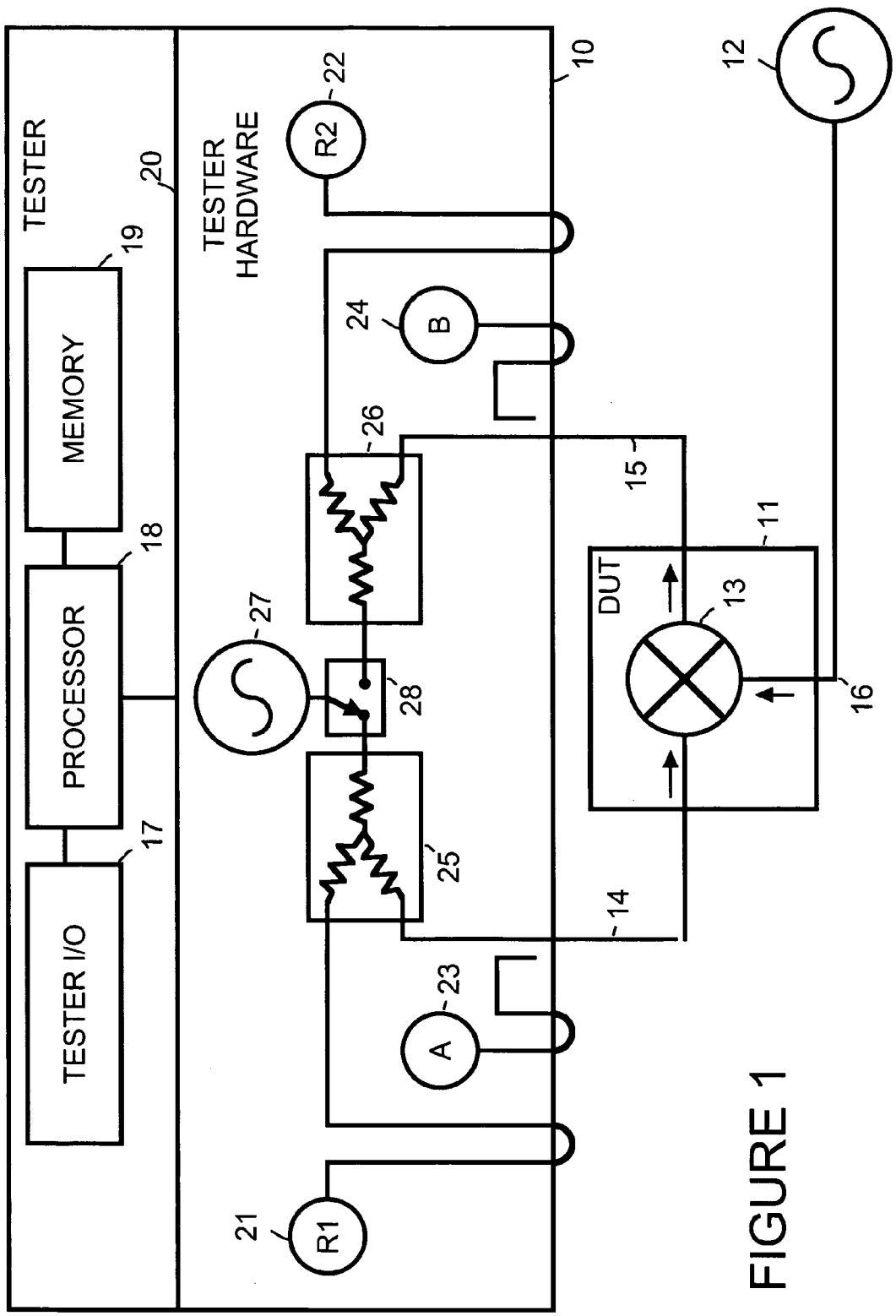
FIG. 1 is a simplified block diagram of a tester configured to test a frequency converter.

FIG. 1 shows a device under test (DUT) 11 and a tester 10. For example, DUT 10 is a frequency converter. DUT 11 includes a mixer 13. While only one mixer 13 is shown within DUT 11, as will be understood by persons of ordinary skill in the art, the principles of the present invention are equally applicable to frequency converters with multiple mixers.

A local oscillator (LO) 12 provides a signal to an LO port 16 of DUT 11.

A tester 10 includes tester input/output (I/O) 17, a processor 18, a memory 19 and tester hardware 20. Tester hardware 20 includes a port 14, a port 15, a first reference (R1) receiver 21, a second reference (R2) receiver 22, a port one (A) receiver 23 a port two (B) receiver 24, an internal source 27, a splitter 25 and a splitter 26. A switch 28 connects internal source 27 to splitter 25 or splitter 26. First reference (R1) receiver 21 measures the reference signal (R1) for port 14. Second reference (R2) receiver 22 measures the reference signal (R2) for port 15. Port one (A) receiver 23 measures the reflection signal (A) at port 14 when DUT 11 is stimulated at port 14 and measures the transmitted signal when DUT 11 is stimulated at port 15. Port two (B) receiver 24 measures the reflection signal (B) at port 15 when DUT 11 is stimulated at port 15 and measures the transmitted signal when DUT 11 is stimulated at port 14. While for explanatory and exemplary purposes, tester 10 is shown as a two-port network analyzer with a particular receiver configuration, the measurements described below can be performed on any two or more port network analyzer that allow their source to be tuned to a different frequency than their receivers.

Figure 2:
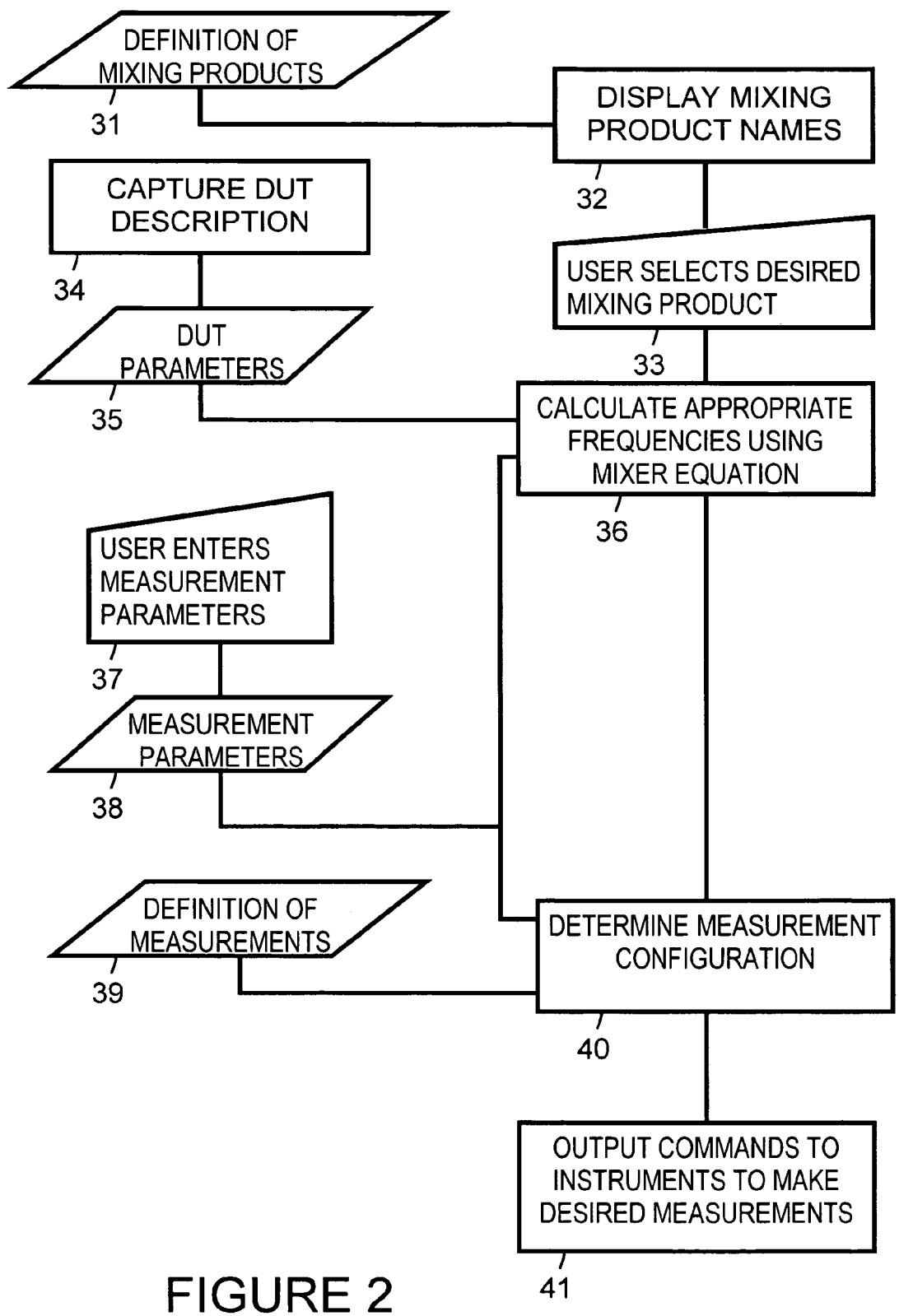
FIG. 2 is a simplified flowchart that illustrates operation of an interface display for a tester in accordance with an embodiment of the present invention.

FIG. 2 is a simplified flowchart that illustrates operation of an interface for tester 10. The interface is, for example, provided by processor 18, memory 19 along with an input device and display included within tester I/O 17. Alternatively, part or all of the interface can be implemented remotely by a computing system external to tester 10.

In block 32, the interface displays mixing product names to a user. In block 31, the definition of mixing products is stored within memory 19 of tester 10, shown in FIG. 1. An embodiment of a definition of mixing products is more fully given in Table 1 below. The definition of mixing products serves to translate between user concepts such as "input match" and "3/2 spur" and the tester setup parameters. Table 1 below is specific to network analyzers with the components shown in FIG. 8. As will be understood by persons of ordinary skill in the art, different tables can be constructed for any stimulus and response electronic equipment.

Figure 3:
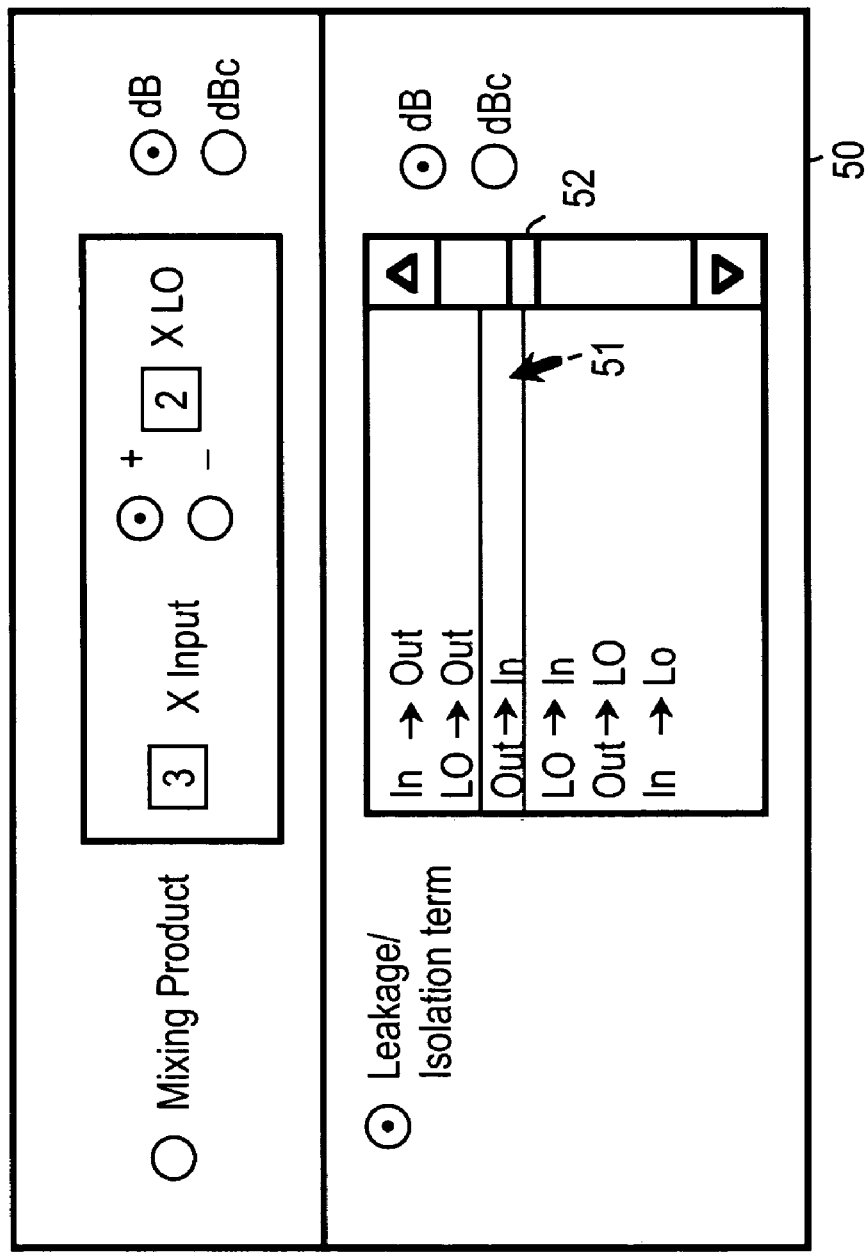

In block 33, the user selects a desired mixing product. FIG. 3 shows a simplified interface window 50 that can be used for selecting the desired mixing product. For example, the user can use a cursor 51 to select a mixing product or a leakage/isolation term. FIG. 3 shows the following leakage/isolation terms: In→Out; LO→Out; Out→In; LO→In; LO→In; Out→LO; In→LO. Other leakage/ isolation terms can be accessed using scroll bar 52. As will be understood by a person of ordinary skill in the art, and as is clear from Table 1 below, the leakage/isolation terms In→Out; LO→Out; Out→In; LO→In; LO→In; Out→LO; In→LO each represent a mixing product, particularly, they represent the mixing products defined by Table 1 below. When displayed to a user, the leakage/isolation terms are displayed using the labels In→Out, LO→Out, Out→In, LO→In, LO→In, Out→LO, In→LO rather than by their mixing product definition. This allows the user to select a leakage/isolation term without specifying the mixing product definition for the leakage/isolation term.

Figure 4:
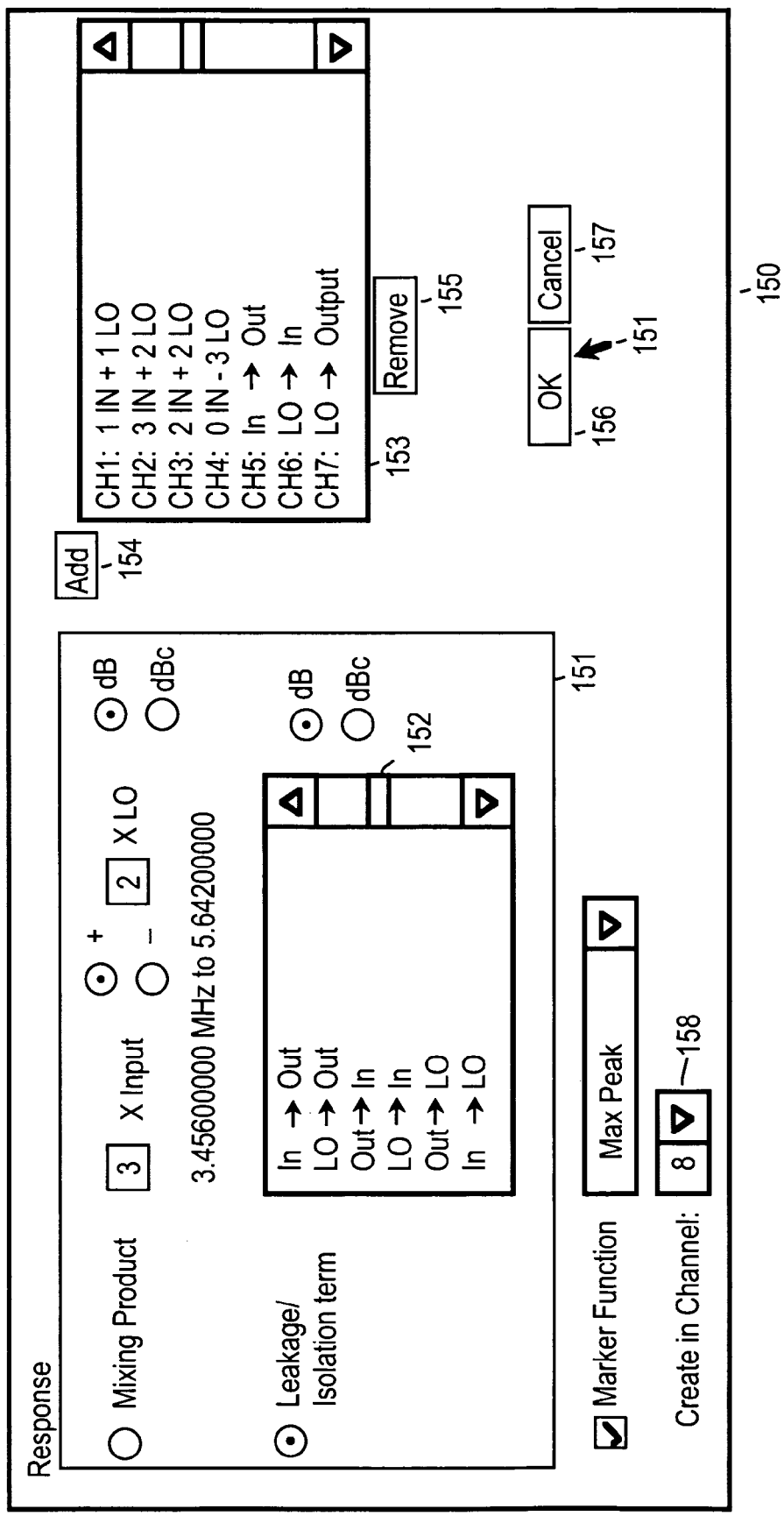

FIG. 4 shows another simplified interface window 150 that can be used for selecting multiple mixing products to measure. For example, the user can use a cursor 151 to highlight a mixing product or a leakage/isolation term. FIG. 4 shows the following leakage/isolation terms: In→Out; LO→Out; Out→In; LO→In; LO→In; Out→LO; In→LO. Other leakage/isolation terms can be accessed using scroll bar 152.

Using box 158, the user can select a channel for the highlighted mixing product or leakage/isolation term. When the user selects Add button 154, the highlighted mixing product or leakage/isolation term is added as a new entry to box 153 for the selected channel. Entries can be removed from box 153 by selecting the entry and selecting remove button 155. An OK button 156 and a Cancel button 157 are shown.

Figure 5:

FIG. 5 shows another simplified interface window 250 that can be used for selecting multiple mixing products to measure. Alternatively, other types of user interfaces can be used such as a fill-in-the-form interface similar to a specification sheet.

In block 34, shown in FIG. 2, a description of DUT 11 is captured and used to assemble DUT parameters 35. A description of DUT 11 includes, for example, four parameters: (1) input stimulus frequency or frequency range; (2) LO stimulus frequency of frequency range for one or more local oscillators; (3) any internal multipliers; or (4) positive or negative mixing product used as output from every stage except the last stage on a multistage mixer.

The description of DUT 11 can be entered by a user using an interface dedicated to receiving this information from a user. Alternatively, the user may enter a description of the DUT using a more general interface, for example, one that can be used to enter exhaustive information about a frequency converter and DUT.

For example, FIG. 6 shows a general purpose configure interface display 130 generated by tester I/O 17, processor 18 and memory 19. Configure interface display 130 allows information to be specified about frequency converters with multiple mixers. For example, in an area 131, a user can specify information about the input signal (Input) to be placed on a frequency converter input port. The user can specify the input signal is fixed, can specify a specified frequency range, can specify a list of fixed frequencies or can specify a list of frequency ranges. Frequency range can be specified, for example, by selecting start and stop values, or by selecting a center frequency and a frequency span. In the example shown in FIG. 6, the frequency range of the Input signal is specified by start and stop values.

In an area 132, the user can specify information about the LO1 signal to be placed on an LO1 port. The user can specify the LO1 signal is fixed, can specify a specified frequency range, can specify a list of fixed frequencies or can specify a list of frequency ranges. In the example shown in FIG. 6, the user has selected a fixed frequency.

In an area 134, the user can specify information about the LO2 signal to be placed on an LO2 port. The user can specify the LO2 signal is fixed, can specify a specified frequency range, can specify a list of fixed frequencies or can specify a list of frequency ranges. In the example shown in FIG. 6, the user has selected a fixed frequency.

In an area 133, the user can specify information about the IF signal expected on an IF line within the frequency converter. In an area 135, the user can specify information about the output signal expected on the frequency converter output.

An area 136 includes a Hide/Show button that allows a user to hide or show the diagram displayed in an area 137. In area 136, the user can specify whether the frequency converter to be tested has one local oscillator or two. In area 136 a user can also invoke a Load button, a Save button, an Apply button, an OK button, a Cancel button and a Help button. While in area 136 buttons are presented, as will be understood by persons of ordinary skill in the art, the buttons could be replaced with other types of commands that facilitate selection by a user. These could include, for example, pull down menus, special keyboard commands, etc.

Area 137 shows a diagram that presents to the user information about a test to be performed on a frequency converter. Area 137 also includes a Configure button 141, used for configuration of LO, and a Configure button 142, used for configuration of LO2.

When all the necessary information about the input signal, the LO1 signal and the LO2 signal is specified, the user can select calculate button 138 and the tester will calculate expected values for the output signal and expected values for the IF signal. The calculated values are displayed within configuration interface display 130. As will be understood by persons of ordinary skill in the art, the calculate buttons could be replaced with other types of commands that facilitate selection by a user. These could include, for example, pull down menus, special keyboard commands, etc.

When the information about the expected IF signal, the LO1 signal and the LO2 signal, has been specified, the user can select calculate button 139 and the tester will calculate the input signal and expected values for the output signal.

When the information about the expected output signal has been specified, the LO1 signal and the LO2 signal, the user can select calculate button 140 and the tester will calculate the input signal and expected values for the IF signal.

To make measurements, the tester provides signal stimulus to the frequency converter at the input port, the LO1 port and the LO2 port, and measures the response at the output port. The described embodiments of the present invention simplifies the set-up of tests without a user being required to specify all of the information requested by general purpose configure interface display 130 shown in FIG. 6.

In block 37, shown in FIG. 2, a user enters measurement parameters which are stored, as represented by block 38. For example, the measure parameters can be entered using the general purpose configure display 130 shown in FIG. 6. Alternatively, measurement parameters can be entered by a user using an interface dedicated to receiving this information from a user.

For example, FIG. 7 shows a user interface 60 allowing a user to specify a sweep type, input start frequency, input stop frequency, input power LO information, intermediate frequency bandwidth (IFBW) and the number of steps to make in the frequency range.

In block 36 shown in FIG. 2, the appropriate frequencies for the desired mixing product (or products) selected in block 33 by the user are calculated. Tester 10 makes the calculations based on the DUT parameters (block 35), on the measurement parameters (block 38) and on the description stored in the definition of mixing products (block 31) for the desired mixing product (or products) selected in block 33.

The appropriate frequencies are calculated using the mixer equation (shown below):

Mixer Equation $$F_{Mixing\ Product} = ((N1*X1)/(N2*X2))*F_{Input} +/- (M1*Y1)*F_{LO1} +/- (M2*Y2)*F_{LO2}$$

In the mixer equation, the values N1, N2, M1 and M2 are defined for the particular desired mixing product within the definition of mixing products (block 31). The values X1, X2, Y1 and Y2 represent any internal multipliers as specified by the DUT parameters (block 35). The values are signal frequency values $F_{Input}$, $F_{LO1}$, $F_{LO2}$ are specified by the measurement parameters (block 38). The value $F_{Mixing\ Product}$ is frequency range at which to make the measurement defined for the particular desired mixing product within the definition of mixing products (block 31).

In FIG. 2, in block 40 the measurement configuration is determined. This final configuration takes into account input power (specified as part of the measurement parameters (block 38)), and any other needed parameters which are part of the test and are part of DUT parameters (block 35), measurement parameters (block 38) or within the definition of a desired mixing product (block 31).

In a block 41, processor 18 outputs commands to tester hardware 20, local oscillator 12 and/or any other appropriate instruments to make the specified measurements.

Table 1 below is an example of definitions of various types of mixer measurements for a network analyzer testing a frequency converter with a single mixer using the configuration shown in the block diagram shown in FIG. 8.

The first column of Table 1 indicates the name of the measurement displayed to the user. The second column indicates whether the input or the output port of the DUT is stimulated. The third column indicates whether a local oscillator (LO) is used for stimulation. The fourth column indicates the receiver frequency.

The fifth column of Table 1 indicates the measurement definition. For example, "R1" indicates a measurement taken by first reference (R1) receiver 21. "R2" indicates a measurement taken by second reference (R2) receiver 22. "A" indicates a measurement taken by port one (A) receiver 23. "B" indicates a measurement taken by port two (B) receiver 24.

The sixth column of Table 1 indicates the name of the parameter being measured. The seventh column indicates the source port stimulation. For example, for tester 10 shown in FIG. 1, if the value in the seventh column is a "1", that indicates internal source 27 is connected to splitter 25. If the value in the seventh column is a "2", that indicates internal source 27 is connected to splitter 26.

For "Match", there are three measurements. The LO match measurement is a pseudo S22 measurement performed using an external source and an external test set. Such a set-up is illustrated by FIG. 8.

Figure 8:
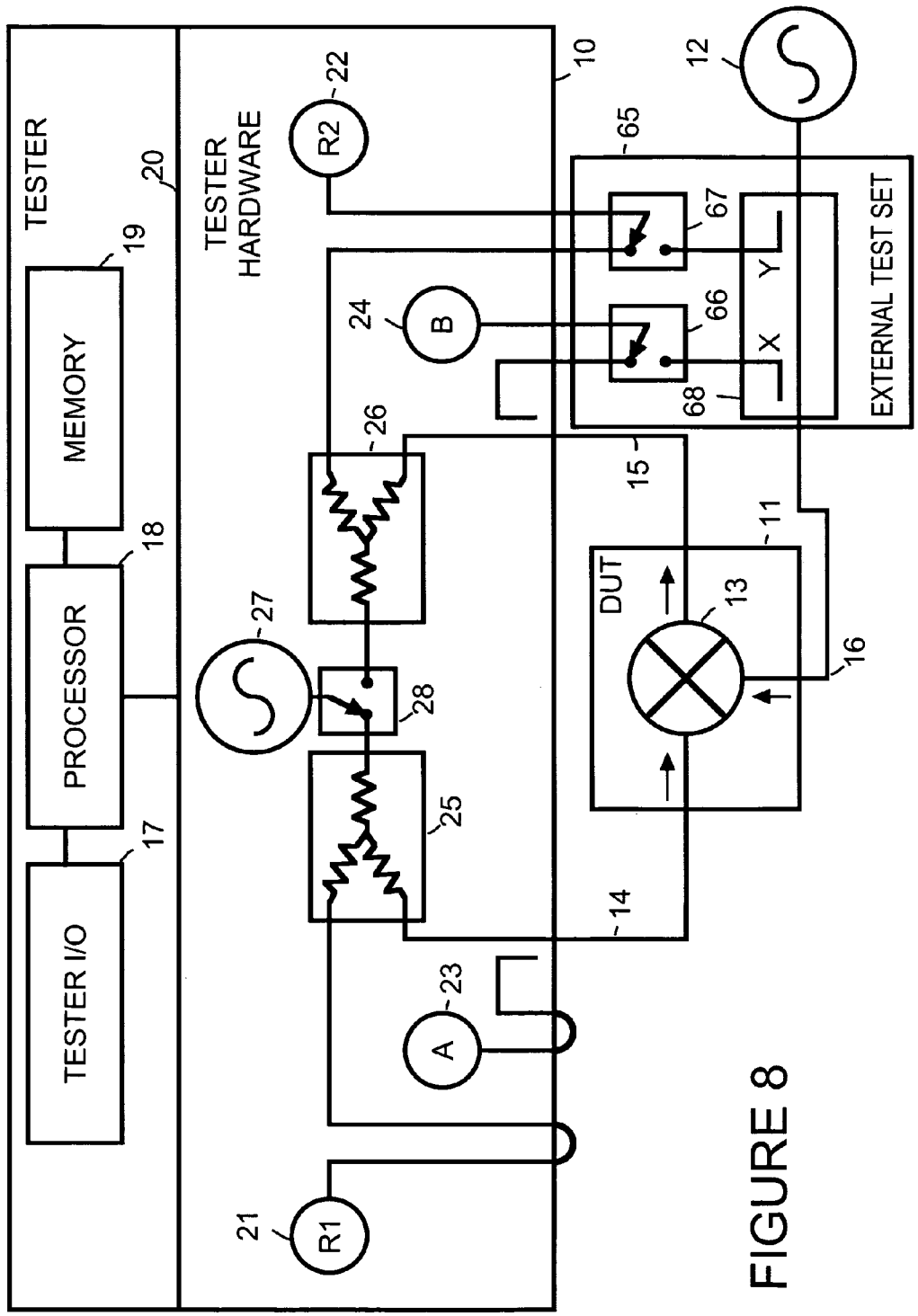
FIG. 8 is a simplified block diagram of the tester shown in FIG. 1 with an external test set added.

In FIG. 8, an external test set 65 has been connected to tester 10 and DUT 11. External test set 65 includes X and Y receivers 68, a switch 66 and a switch 67. Reference receiver

TABLE 1

| Measurement | Stim | LO Stim | Receiver: Frequency | Measurement Definition | Parameter | Source Port |
|---|---|---|---|---|---|---|
| Match | | | | | | |
| Input | Input | LO | Input | A/R1 | S11 | 1 |
| Output | Output | LO | Output | B/R2 | S22 | 2 |
| LO | None | LO | LO | X/Y | Pseudo S22 | 2-switchd to Ext. |
| Isolation | | | | | | |
| In->Out | Input | LO | Input | B/R1 | S21 | 1 |
| LO->Out | None | LO | LO or LO2 | B/Y | Pseudo S21 | External LO |
| Out->In | Output | LO | Output | A/R2 | S12 | 2 |
| LO->In | None | LO | LO | A/Y | Pseudo S12 | External LO |
| Out->LO | Output | LO | Out | X/R2 | Pseudo S12 | 2 |
| In->LO | Input | LO | In | X/R1 | Pseudo S21 | 1 |
| Power Sweep | | | | | | |
| Conversion Gain vs. Input Power | Input | LO | Out | B/R1 (offset mode) | C21 | 1 |
| Input Match vs. Input Power | Input | LO | In | A/R1 | S11 | 1 |
| Spurious | | | | | | |
| Spur Table | Input | LO | Out & Spur | B(spur)/B(out) | OB(spur)/OB(out) | 1 |
| Image Rejection | Input | LO | Out & image | B(image)/B(out) | OB(image)/OB(out) | 1 |
| Swept Spur | Input | LO | Out & spur | B(spur)B(out), S1 | OB(spur)/OB(out) | 1 |
| Gain | | | | | | |
| Conversion Gain | Input | LO | Out | B/R1 | C21 | 1 |
| Gain compression | Input | LO | Out | B/R1 | C21 | 1 |

Y measures the reference signal (Y) for external LO source 12. Reflection receiver X measures the reflection signal (X) from LO port 16.

In Table 1, there are six isolation measurements. The LO to output isolation measurement requires either a customized two port cal that uses port two (B) receiver 24 in dual roles or a simple normalization cal. The LO to input isolation measurement requires either a customized two port cal or a simple normalization cal. The output to LO isolation measurement requires either a customized two port cal or a simple normalization cal.

In Table 1, there are two power sweep measurements. The conversion gain verses input power measurement is performed over a specified range (or a list) of input powers. For a constant wave (CW) measurement the result is displayed as a trace of C21 verses input power. For a swept measurement, the result is a family of traces, each at a single input power level. The input match verse input power measurement is the standard S11 measurement and is performed over a specified range (or a list) of input powers. For a CW measurement, the result is displayed as a trace of S11 verses input power. For a swept measurement, the result is a family of traces, each at a single input power level.

In Table 1, there are three spurious signal measurements. The spur table measurement is output power relative to a user defined output signal for N×M mixer product (See FIG. 5 where N refers to a row and M refers to a column of simplified interface window 250). The scalar mixer calibration (SMC) cal type can correct the output power of the DUT so that the measurement at port two (B) receiver 24 is the corrected output power of the DUT into a 50 Ohm load. This is a CW measurement and if multiple products are selected a table of results is produced. The SMC cal type is a calibration technique used for correcting the magnitude and match errors in some mixer measurements.

The swept spur measurement is for given N×M mixer product verses input frequency. This is a swept frequency measurement for a single product.

In Table 1, there are two gain measurements. The conversion gain measurement is the standard swept frequency C21 measurement. The gain compression measurement is swept both over frequency and power. At each frequency a power sweep is done to determine the input or the output power at the desired compression level. The result is a trace of input (or output) power at compression verses frequency.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for testing a frequency converter comprising:
   (a) displaying labels for a plurality of mixing products that can be produced by mixing signals within the frequency converter; and,
   (b) in response to a user selecting a first mixing product from the plurality of mixing products, performing the following:
      (b1) calculating appropriate frequencies for the first mixing product, and
      (b2) determining a measurement configuration for the first mixing product.

2. A method as in claim 1 wherein in (a) the labels are obtained from a table defining the plurality of mixing products.

3. A method as in claim 1 wherein (b1) includes using parameters for the frequency converter.

4. A method as in claim 1 wherein (b1) includes using parameters for the frequency converter and measurement parameters obtained from the user.

5. A method as in claim 1 wherein (b) additionally includes performing the following:
   (b3) sending commands to hardware to make measurements.

6. A method as in claim 5 wherein the hardware in (b3) includes tester hardware and an external local oscillator.

7. A method as in claim 1 wherein in the plurality of mixing products include at least one of the following measurements:
   Match Input;
   Match Output;
   Isolation In->Out;
   Isolation Out->In;
   Conversion Gain vs. Input Power;
   Input Match verses Input Power;
   Spur Table;
   Image Rejection;
   Swept Spur;
   Conversion Gain;
   Gain compression.

8. A method as in claim 1 wherein (b2) includes using measurement parameters obtained from the user.

9. An interface for a tester comprising:
   a table that defines a plurality of mixing products that can be produced by mixing signals within a frequency converter the table including labels for the plurality of mixing products;
   a first display interface that displays at least a subset of the labels; and,
   a processor that, in response to a user selecting a first mixing product from the plurality of mixing products, calculates appropriate frequencies for the first mixing product, and determines a measurement configuration for the first mixing product.

10. An interface as in claim 9 wherein in the plurality of mixing products include at least one of the following measurements:
    Match Input;
    Match Output;
    Isolation In->Out;
    Isolation Out->In;
    Conversion Gain vs. Input Power;
    Input Match verses Input Power;
    Spur Table;
    Image Rejection;
    Swept Spur;
    Conversion Gain;
    Gain compression.

11. An interface as in claim 9 wherein when determining a measurement configuration for the first mixing product, the processor uses measurement parameters obtained from the user.

12. An interface as in claim 9 wherein when calculating appropriate frequencies for the first mixing product, the processor uses parameters for a device under test.

13. An interface as in claim 9 wherein when calculating appropriate frequencies for the first mixing product, the processor uses parameters for a device under test and measurement parameters obtained from the user.

14. An interface as in claim 9 wherein the processor sends commands to tester hardware to make measurements.

15. An interface for a tester comprising: table means for defining a plurality of mixing products that can be produced by mixing signals within a frequency converter, the table including labels for the plurality of mixing products;
- interface means for displaying at least a subset of the labels; and,
- processor means for, in response to a user selecting a first mixing product from the plurality of mixing products, calculating appropriate frequencies for the first mixing product, and determining a measurement configuration for the first mixing product.

16. An interface as in claim 15 wherein in the plurality of mixing products include at least one of the following measurements:
- Match Input;
- Match Output;
- Isolation In->Out;
- Isolation Out->In;
- Conversion Gain vs. Input Power;
- Input Match verses Input Power;
- Spur Table;
- Image Rejection;
- Swept Spur;
- Conversion Gain;
- Gain compression.

17. An interface as in claim 15 wherein when determining a measurement configuration for the first mixing product, the processor means uses measurement parameters obtained from the user.

18. An interface as in claim 15 wherein when calculating appropriate frequencies for the first mixing product, the processor means uses parameters for a device under test.

19. An interface as in claim 15 wherein when calculating appropriate frequencies for the first mixing product, the processor means uses parameters for a device under test and measurement parameters obtained from the user.

20. An interface as in claim 15 wherein the processor means sends commands to tester hardware to make measurements.

* * * * *

UNITED STATES PATENT AND TRADEMARK OFFICE
CERTIFICATE OF CORRECTION

PATENT NO.         : 7,061,222 B2
APPLICATION NO.    : 10/691267
DATED              : June 13, 2006
INVENTOR(S)        : Shank et al.

It is certified that error appears in the above-identified patent and that said Letters Patent is hereby corrected as shown below:

On Title Page Item 56 under "Other Publications", in column 2, line 1, delete "875ES" and insert -- 8753ES --, therefor.

In column 8, line 34, in Claim 9, after "converter" insert -- , --.

Signed and Sealed this

Seventh Day of November, 2006

JON W. DUDAS
*Director of the United States Patent and Trademark Office*